United States Patent
Ghorbanzadeh et al.

(10) Patent No.: US 10,510,741 B2
(45) Date of Patent: Dec. 17, 2019

(54) TRANSIENT VOLTAGE SUPPRESSION DIODES WITH REDUCED HARMONICS, AND METHODS OF MAKING AND USING

(71) Applicant: Semtech Corporation, Camarillo, CA (US)

(72) Inventors: Maykel Ghorbanzadeh, Newbury Park, CA (US); Jonathan Clark, Camarillo, CA (US); William A. Russell, Thousand Oaks, CA (US)

(73) Assignee: Semtech Corporation, Camarillo, CA (US)

( * ) Notice: Subject to any disclaimer, the term of this patent is extended or adjusted under 35 U.S.C. 154(b) by 0 days.

(21) Appl. No.: 15/721,488

(22) Filed: Sep. 29, 2017

(65) Prior Publication Data
US 2018/0102356 A1 Apr. 12, 2018

Related U.S. Application Data

(60) Provisional application No. 62/405,135, filed on Oct. 6, 2016.

(51) Int. Cl.
*H01L 27/02* (2006.01)
*H01L 25/16* (2006.01)
(Continued)

(52) U.S. Cl.
CPC ...... *H01L 27/0255* (2013.01); *H01L 23/3114* (2013.01); *H01L 23/5223* (2013.01); *H01L 25/16* (2013.01); *H01L 27/0288* (2013.01); *H01L 27/0788* (2013.01); *H01L 28/40* (2013.01); *H01L 29/0649* (2013.01); *H01L 29/861* (2013.01); *H01L 29/864* (2013.01); *H01L 2224/11* (2013.01)

(58) Field of Classification Search
CPC ............................ H01L 21/07; H01L 21/0744
See application file for complete search history.

(56) References Cited

U.S. PATENT DOCUMENTS 6,977,198 B2    12/2005  Gau
2010/0060349 A1  3/2010  Etter et al.
(Continued)

OTHER PUBLICATIONS

Schwingshackl, Thomas et al., Key Performance Parameters of ESD Protection Devices for High Speed I/O, RF and Monolithic Microwave Integrated Circuits, ARMMS RF & Microwave Society Conference, Nov. 19-20, 2012, pp. 1-5, Wyboston Lakes, Wyboston, UK.

*Primary Examiner* — Cheung Lee
(74) *Attorney, Agent, or Firm* — Brian M. Kaufman; Robert D. Atkins; Patent Law Group: Atkins and Associates, P.C.

(57) ABSTRACT

A semiconductor device includes a semiconductor die. A transient voltage suppression (TVS) structure is formed in the semiconductor die. A capacitor is formed over the semiconductor die. In one embodiment, the capacitor is formed by depositing a first conductive layer over the semiconductor die, depositing an insulating layer over the first conductive layer, and depositing a second conductive layer over the semiconductor die. In another embodiment, the capacitor is formed by forming a trench in the semiconductor die, depositing an insulating material in the trench, and depositing a conductive material in the trench.

25 Claims, 11 Drawing Sheets

(51) Int. Cl.
*H01L 49/02* (2006.01)
*H01L 29/864* (2006.01)
*H01L 23/31* (2006.01)
*H01L 23/522* (2006.01)
*H01L 29/861* (2006.01)
*H01L 29/06* (2006.01)
*H01L 27/07* (2006.01)

(56) References Cited

U.S. PATENT DOCUMENTS

| | | |
|---|---|---|
| 2010/0123217 A1 | 5/2010 | Poppel et al. |
| 2010/0276805 A1* | 11/2010 | Tu ................ H01L 23/5223 257/760 |
| 2011/0096447 A1 | 4/2011 | Higuchi et al. |
| 2013/0168837 A1 | 7/2013 | Kato et al. |
| 2015/0371941 A1 | 12/2015 | Nakaiso et al. |
| 2016/0095221 A1 | 3/2016 | Ramachandran et al. |
| 2017/0069620 A1* | 3/2017 | Tu ................ H01L 27/067 |

\* cited by examiner

TRANSIENT VOLTAGE SUPPRESSION DIODES WITH REDUCED HARMONICS, AND METHODS OF MAKING AND USING

CLAIM TO DOMESTIC PRIORITY

The present application claims the benefit of U.S. Provisional Application No. 62/405,135, filed Oct. 6, 2016, which application is incorporated herein by reference.

FIELD OF THE INVENTION

The present invention relates in general to semiconductor devices and, more particularly, to a semiconductor device and method of reducing harmonic generation in transient voltage suppression diodes.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal-oxide-semiconductor field-effect transistor (MOSFET). Integrated semiconductor devices typically contain hundreds to millions of electrical components. Examples of integrated semiconductor devices include microcontrollers, microprocessors, charge-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Electronic devices commonly include transient voltage suppression (TVS) diodes coupled in parallel with a load. The TVS diode shunts transient voltage spikes away from the load through the TVS diode to protect the load. One problem with TVS diodes is that TVS diodes can contribute to the generation of unwanted harmonics in electronic devices. Harmonics generated by TVS diodes are especially problematic when used near radio frequency (RF) signal paths or power lines. A harmonic is a signal or waveform with a frequency that is an integer multiple of the fundamental frequency. Thus, for a signal with a frequency f, the second harmonic frequency is 2f, the third harmonic is 3f, and so forth.

If enough energy is contained within the generated harmonic signals, the harmonics can cause significant interference and distortions of the primary waveform on the RF or power lines at the fundamental frequency. Harmonics, particularly odd harmonics, are generated due to nonlinearities. In the case of TVS diodes, there is a non-linear dependence of capacitance on reverse voltage (dCj/dVR) because TVS diodes are solid-state, silicon avalanche devices that are constructed with one or more p-n junctions. The width of the depletion region of a p-n junction changes with voltage, thus causing a non-linear change in capacitance of the TVS diode.

A need exists to reduce harmonic generation of TVS diodes by generating a more linear capacitance value of the device.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, those skilled in the art will appreciate that the description is intended to cover alternatives, modifications, and equivalents as may be included within the spirit and scope of the invention as defined by the appended claims and the claims' equivalents as supported by the following disclosure and drawings.

Figure 1A:
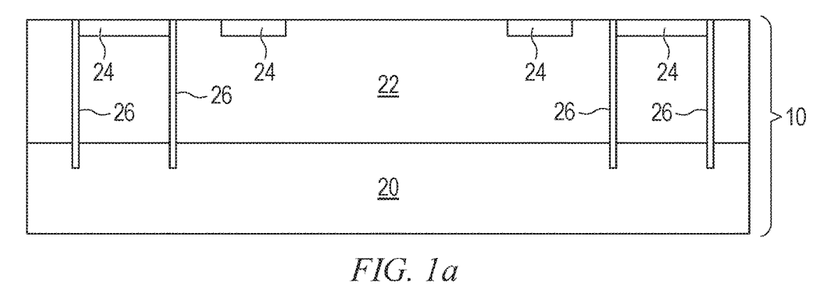
FIGS. 1a-1e illustrate formation of a MIM capacitor over a TVS diode.
Figure 3:
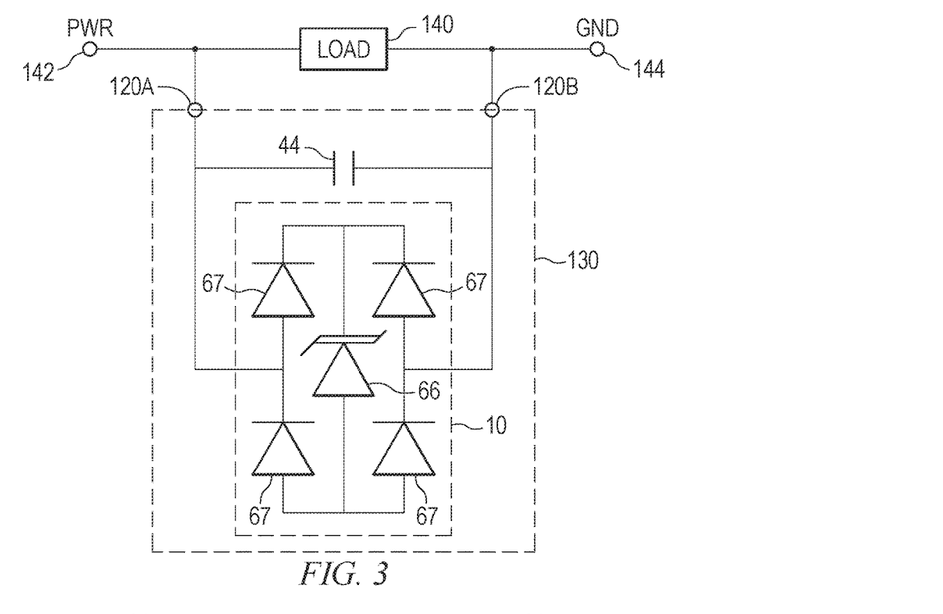
FIG. 3 illustrates a circuit diagram of the TVS diode and MIM capacitor protecting a load.

FIG. 1a illustrates a semiconductor die 10 with a TVS diode and steering diodes formed in the semiconductor die. Semiconductor die 10 includes a positively doped (p-doped) region 20 and a negatively doped (n-doped) region 22. In one embodiment, p-doped region 20 is a base wafer and n-doped region 22 is an epitaxial layer grown on the base wafer. Trenches 26 are formed into semiconductor die 10 through n-doped region 22 to electrically isolate terminals of the TVS diode. An insulating material is deposited into trenches 26 to fill the trenches. P-doped regions 24 are diffusion regions that are doped to form steering diodes for the TVS diode. The p-n junctions between p-doped regions 24 and the n-doped region 22 form four steering diodes as shown in FIG. 3. The p-n junctions between n-doped region 22 and p-doped region 20 form the TVS diode.

While one particular TVS diode embodiment is illustrated, the metal-insulator-metal (MIM) capacitor subsequently formed over semiconductor die 10 can be formed with other TVS or electrostatic discharge (ESD) diode topologies in other embodiments. The underlying TVS diode can be a silicon avalanche p-n junction diode with no snap-back, or a device that exhibits shallow or deep snap-back characteristics. While FIG. 1a illustrates a TVS diode with steering diodes to further reduce junction capacitance, TVS diodes without steering diodes are used in other embodiments. Other alternative protection schemes, including silicon-controlled rectifier (SCR) based devices, are used with the disclosed MIM capacitor. While only a single semiconductor die with a single TVS diode formed therein is illustrated, the following process for forming the MIM capacitor is more commonly formed over an entire wafer of devices at once and then singulated to result in individual die.

Figure 1B:
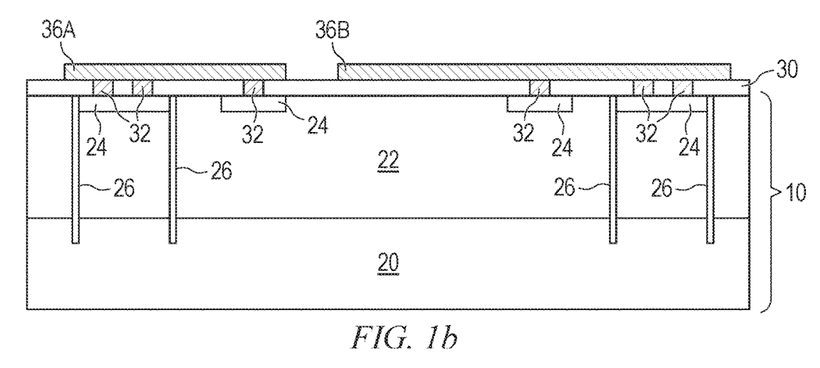

In FIG. 1b, an insulating or passivation layer 30 is formed over semiconductor die 10. Insulating layer 30 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. A portion of insulating layer 30 is removed by laser direct ablation (LDA), chemical etching, or other suitable process to expose diffusion regions 24 for subsequent electrical interconnect.

An electrically conductive layer or electrical contacts 32 are formed in the openings of insulating layer 30 using physical vapor deposition (PVD), chemical vapor deposition (CVD), electrolytic plating, electroless plating, or other suitable metal deposition process. Electrical contacts 32 contain one or more layers of aluminum (Al), copper (Cu), Tin (Sn), Nickel (Ni), Gold (Au), Silver (Ag), or other suitable electrically conductive material. In one embodiment, electrical contacts 32 includes an adhesion or seed layer of Ti/Cu, Titanium Tungsten (TiW)/Cu, or a coupling agent/Cu. Another metal with good wet etching selectivity, such as Ni, Au, or Ag, is optionally added to the seed layer. The seed layer is deposited by sputtering, electroless plating, or by depositing laminated Cu foil combined with electroless plating. In another embodiment, electrical contacts 32 are tungsten pins disposed on semiconductor die 10 prior to deposition of insulating layer 30. Contacts 32 are electrically connected to diffusion regions 24 to provide electrical connection to the terminals of the TVS device.

An electrically conductive layer 36 is formed over insulating layer 30 and electrical contacts 32 using similar materials and processes as described above for electrical contacts 32. In some embodiments, conductive layer 36 is formed by depositing metal and patterning using photolithography. In other embodiments, any suitable additive, semi-additive, or subtractive method for forming conductive layer 36 is used. In some embodiments, conductive layer 36 and electrical contacts 32 are deposited together in the same metal deposition step.

Figure 1C:
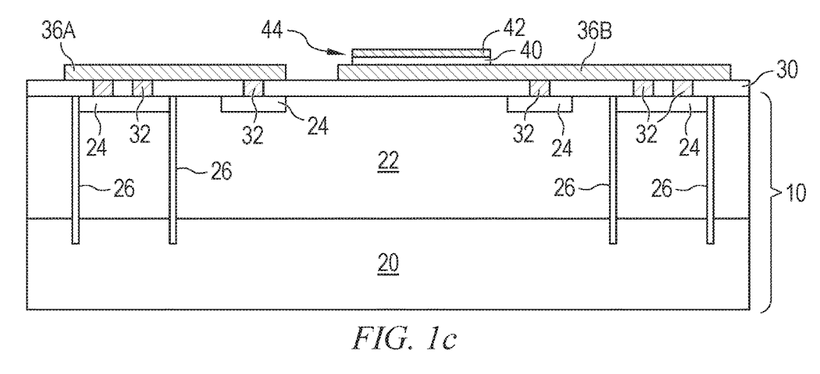

In FIG. 1c, an insulating or dielectric layer 40 is formed over a portion of conductive layer 36B. Dielectric layer 40 is formed and patterned in a similar process to and using similar materials as insulating layer 30. A conductive layer 42 is formed over dielectric layer 40. Conductive layer 42 is formed and patterned in a similar process to and using similar materials as conductive layer 36. In one embodiment, conductive layer 42 is formed from titanium nitride (TiN). TiN is easier to form into thinner layers relative to aluminum, which is commonly used to form the lower conductive layer 36.

Conductive layer 36B and conductive layer 42 operate as plates of MIM capacitor 44, while dielectric layer 40 operates as the capacitor's dielectric layer. A thickness of dielectric layer 40 is adjusted such that the dielectric layer can withstand the clamping voltage of the TVS diode during an ESD event without significant damage to the dielectric layer. Increasing the surface area of dielectric layer 40 and conductive layer 42 in plan view, as well as the underlying portion of conductive layer 36B, increases the capacitance value of MIM capacitor 44. Another portion of conductive layer 36b operates as a conductive trace to couple the plate of capacitor 44 to electrical contacts 32. Insulating layer 30 provides electrical isolation between capacitor 44 and the TVS diode circuit in semiconductor die 10.

Figure 1D:
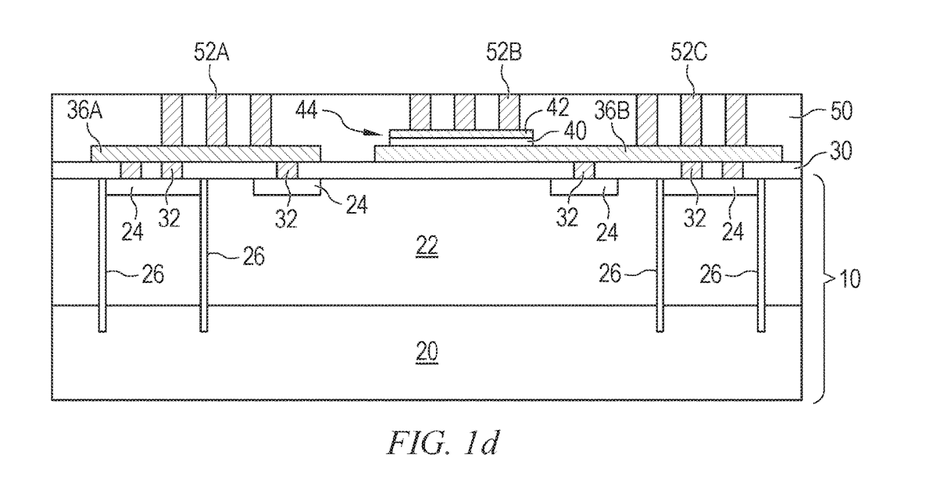

In FIG. 1d, insulating layer 50 is formed over conductive layer 36 and capacitor 44 in a similar manner as insulating layer 30. Electrical contacts 52 are formed through insulating layer 50 to conductive layers 36 and 42 in a similar manner as electrical contacts 32. In some embodiments, electrical contacts 52 are tungsten pins disposed on conductive layers 36 and 42 prior to forming insulating layer 50.

Figure 1E:
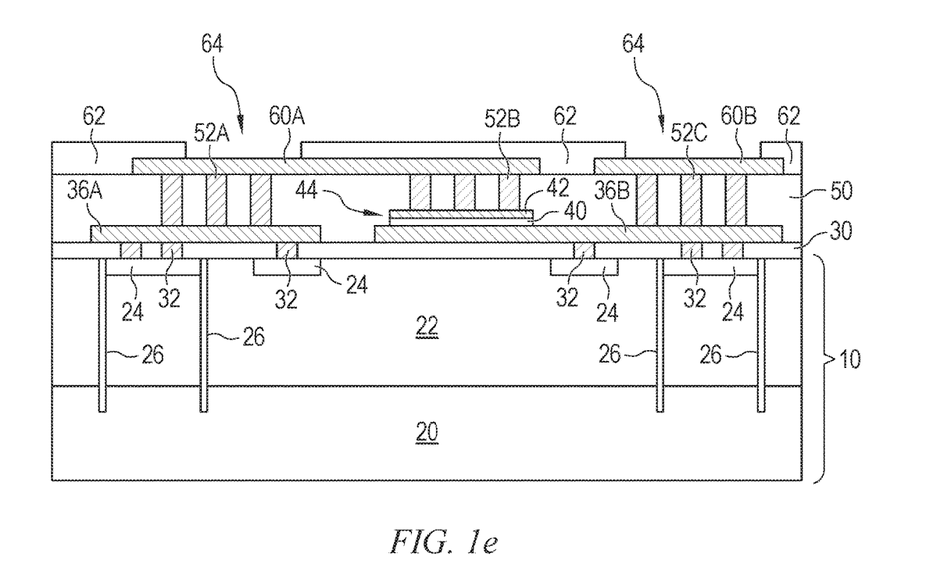

In FIG. 1e, conductive layer 60 is formed over insulating layer 50 and electrical contacts 52. Conductive layer 60 is similar to conductive layer 36, and provides a uniform flat surface for stress relief of the wafer. Conductive layer 60A electrically connects electrical contacts 52A to electrical contacts 52B and conductive layer 42. A passivation layer 62 is formed over conductive layer 60 with openings 64 formed through the passivation layer for electrical interconnect. In some embodiments, conductive bumps or another type of interconnect structure is formed on conductive layer 60 in openings 64 for mounting and/or electrically connecting semiconductor die 10 and capacitor 44 to a printed circuit board (PCB) or other substrate. An under-bump metallization is formed over or under insulating layer 62 in some embodiments.

Conductive layers 60A and 60B operate as two terminals for the TVS device. In some embodiments, interconnect structures are subsequently formed over conductive layers 60A and 60B to couple the TVS diode to a substrate of an electronic device. In other embodiments, conductive layers 60A and 60B remain exposed in a land grid array configuration. Capacitor 44 is coupled in parallel with the TVS diode of semiconductor die 10 between conductive layers 60A and 60B. Conductive layer 60A couples an external circuit to conductive layer 42 of capacitor 44 through electrical contacts 52B and to the underlying TVS device through electrical contacts 52A and conductive layer 36A. Conductive layer 60B couples an external circuit to the opposite plate of capacitor 44, which is a portion of conductive layer 36B, and couples the external circuit to the second terminal of the underlying TVS device through conductive layer 36B.

Capacitor 44 includes a fixed or linear capacitance value. The ratio of capacitance of capacitor 44 and the capacitance of the TVS diode in semiconductor die 10 is selected so that the overall capacitance of the device is dominated by a higher linear capacitance of MIM capacitor 44. In one embodiment, a capacitance value of capacitor 44 is approximately ten times larger than the capacitance of the underlying TVS diode. The linear nature of capacitor 44 substantially masks the non-linear capacitance of the TVS diode resulting in a structure with improved harmonic characteristics. Capacitor 44 integrated in the same semiconductor package with the ESD capability of a TVS diode linearizes the TVS capacitance by adding a larger, stable capacitance in parallel with the TVS junction capacitance.

Figure 2A:
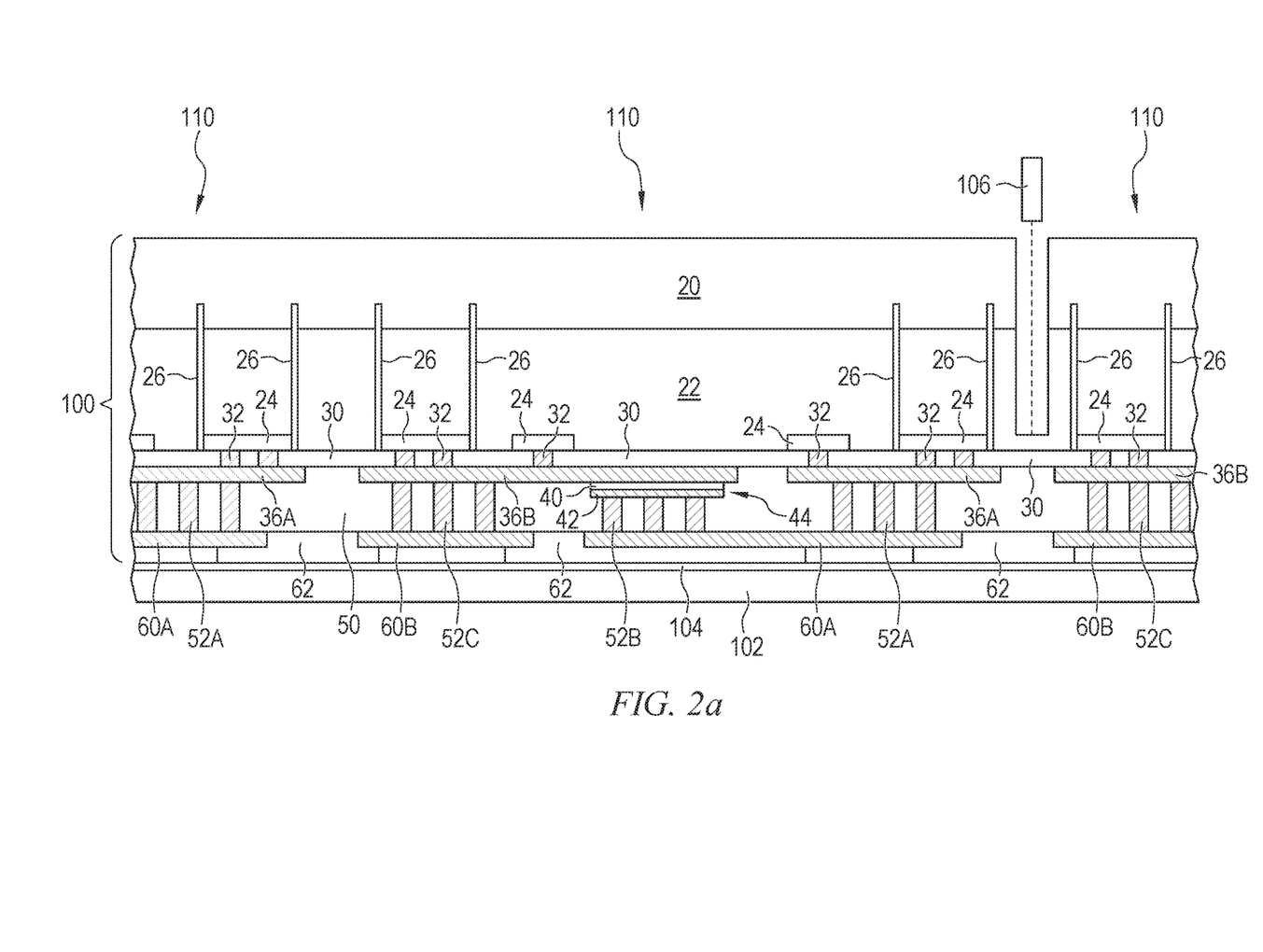
FIGS. 2a-2d illustrate packaging a TVS diode with integrated MIM capacitor.

FIGS. 2a-2d illustrate packaging the above-described TVS device with embedded MIM capacitor 44. In FIG. 2a, a semiconductor wafer 100 has a plurality of TVS devices formed therein. Semiconductor wafer 100 is disposed over a carrier 102 with thermal release tape, UV release tape, double-sided tape, or another type of interface layer 104. Semiconductor wafer 100 is singulated using saw blade or laser cutting tool 106 into a plurality of individual TVS devices 110. Each of the TVS devices 110 includes a MIM capacitor 44 formed in layers over a semiconductor die 10 having a TVS diode.

Figure 2B:
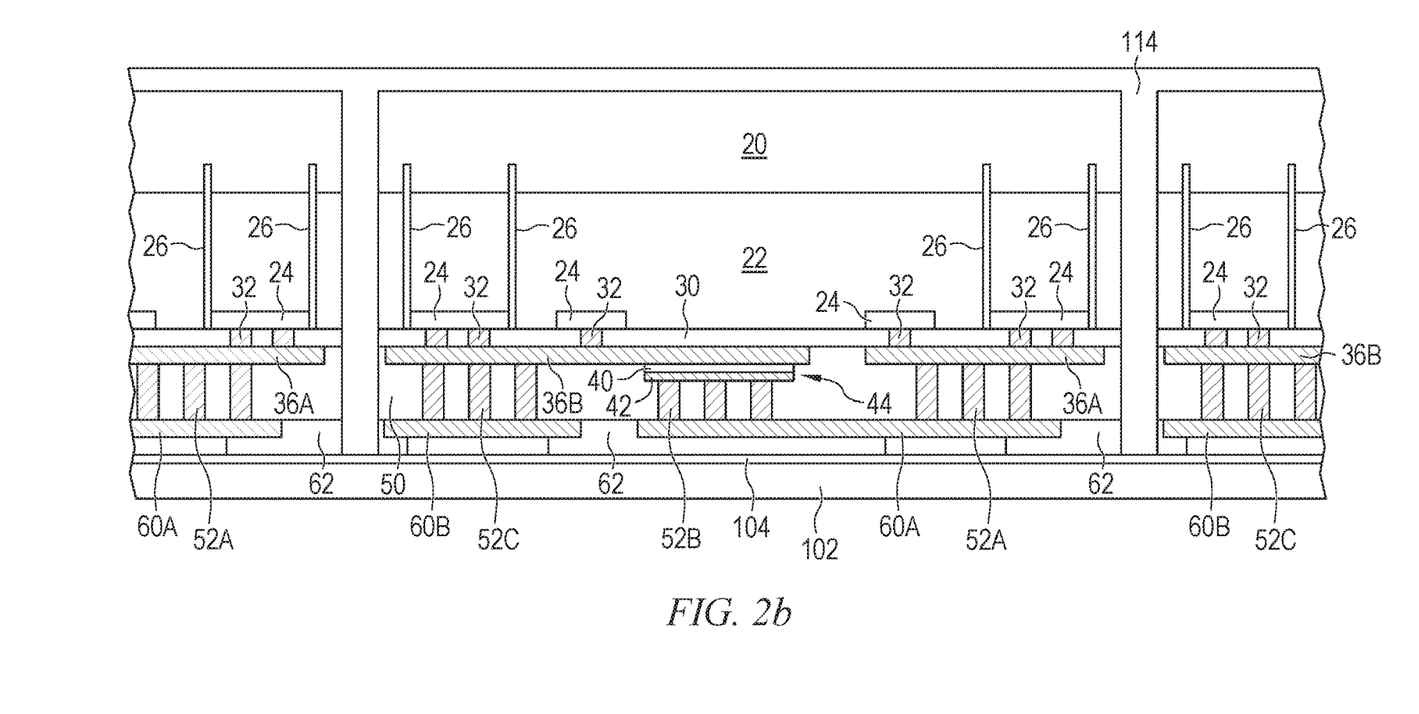

In FIG. 2b, an encapsulant or molding compound 114 is deposited over TVS devices 110 as an insulating material using a paste printing, compressive molding, transfer molding, liquid encapsulant molding, vacuum lamination, spin coating, or other suitable applicator. Encapsulant 114 can be polymer composite material, such as epoxy resin with filler, epoxy acrylate with filler, or polymer with proper filler.

Encapsulant 114 is non-conductive and environmentally protects the semiconductor device from external elements and contaminants. Encapsulant 114 also protects TVS devices 110 from degradation due to exposure to light.

Figure 2C:
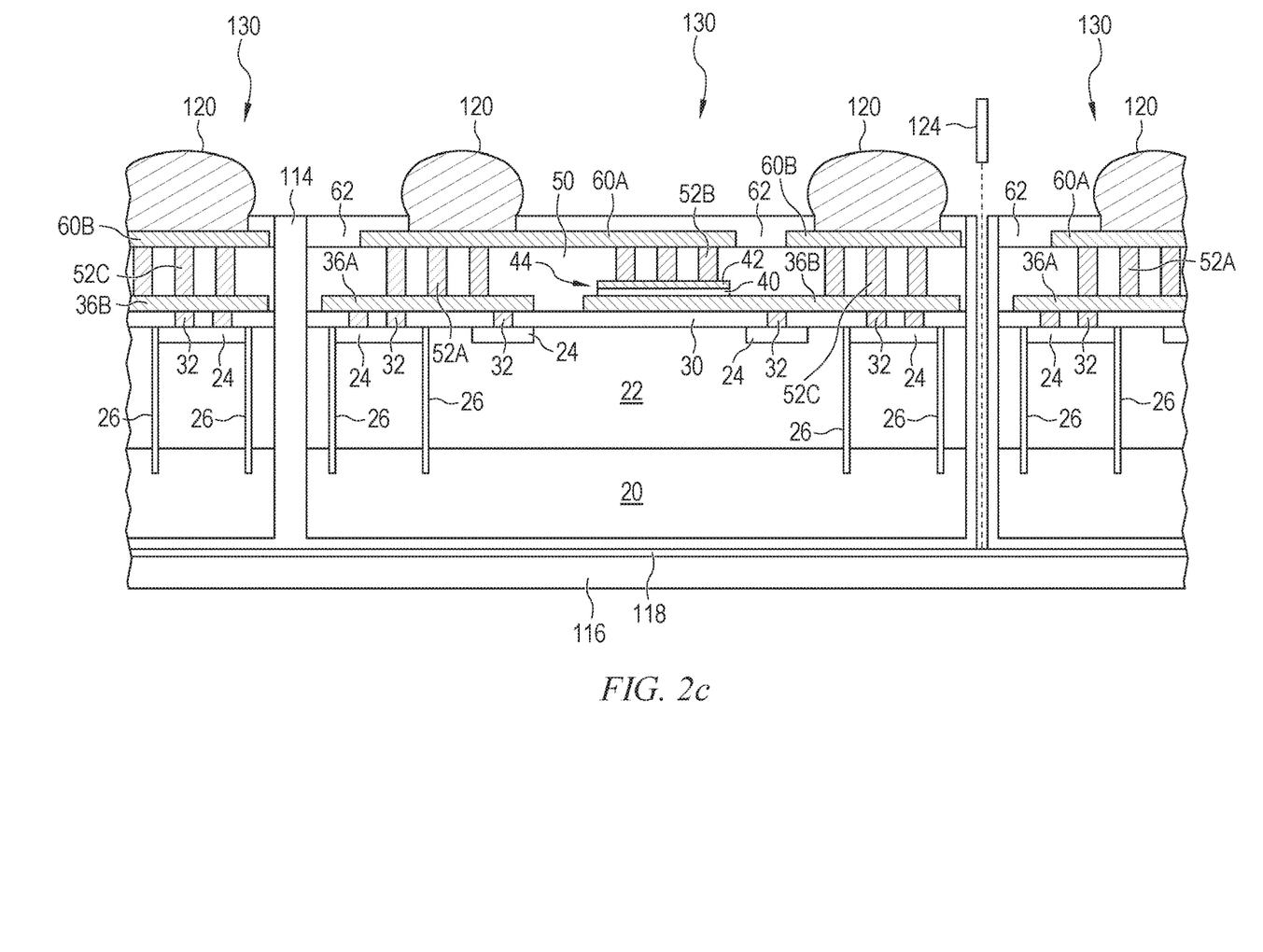

In FIG. 2c, the panel of TVS devices 110 and encapsulant 114 is flipped and disposed over a second carrier 116 with interface layer 118. Conductive bumps 120 are formed on conductive layer 60 in openings 64. To form bumps 120, an electrically conductive bump material is deposited over conductive layer 60 using an evaporation, electrolytic plating, electroless plating, ball drop, or screen printing process. The bump material can be Al, Sn, Ni, Au, Ag, lead (Pb), bismuth (Bi), Cu, solder, and combinations thereof, with an optional flux solution. For example, the bump material can be eutectic Sn/Pb, high-lead solder, or lead-free solder. The bump material is bonded to conductive layer 60 using a suitable attachment or bonding process. In one embodiment, the bump material is reflowed by heating the material above its melting point to form balls or bumps 120. In some applications, bumps 120 are reflowed a second time to improve electrical coupling to conductive layer 60. Bumps 120 can also be compression bonded or thermocompression bonded to conductive layer 60. Bumps 120 represent one type of interconnect structure that can be formed over conductive layer 60. The interconnect structure can also use stud bumps, micro bumps, micro pillars, wire bonds, or other electrical interconnect.

TVS devices 110 are singulated from each other through encapsulant 114 using a saw blade, laser cutting tool, water cutting tool, or other appropriate means into individual TVS packages 130. Singulation can occur before or after formation of bumps 120. In some embodiments, multiple TVS devices 110 are left attached by encapsulant 114, and sold as a single package with multiple TVS devices.

Figure 2D:
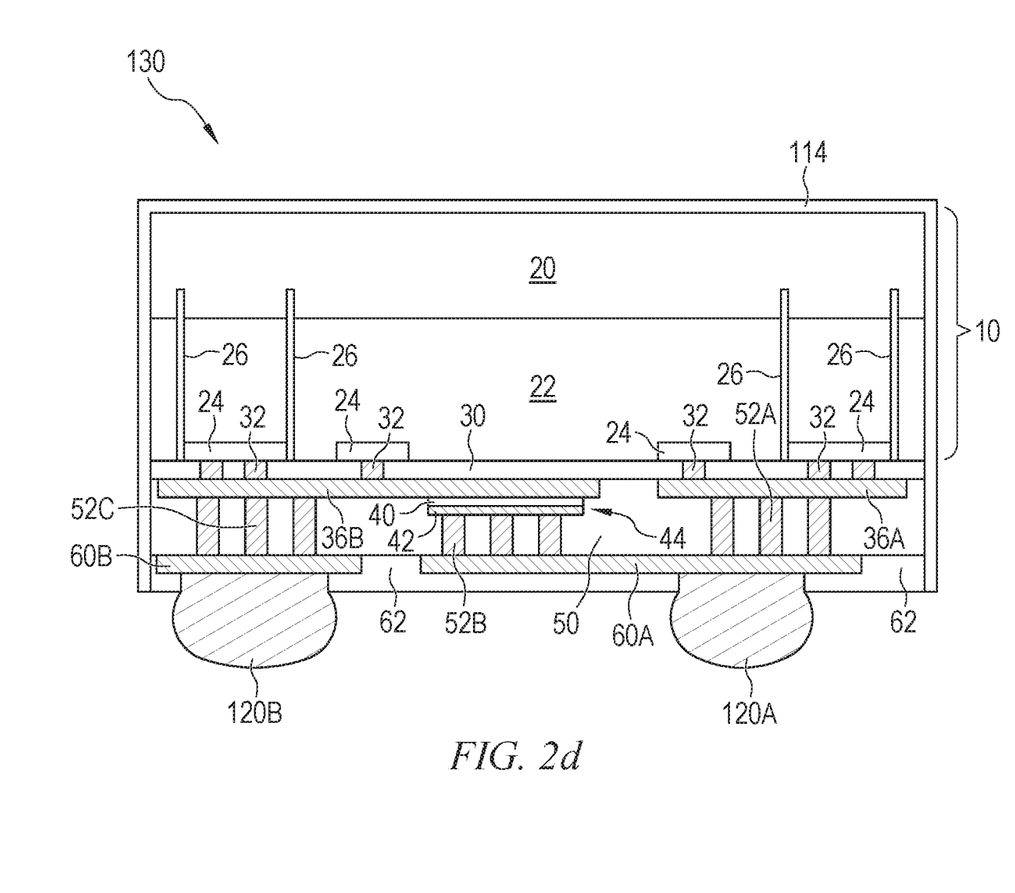

FIG. 2d illustrates a singulated TVS package 130 ready for integration into an electronic device. The TVS diode formed in semiconductor die 10 is electrically coupled in parallel with MIM capacitor 44 between conductive bumps 120A and 120B. For use, TVS package 130 is wired in parallel with a load to protect the load from transient voltage spikes, as shown in FIG. 3. FIG. 3 shows semiconductor die 10 includes a TVS diode 66 formed by p-doped region 20, n-doped substrate 22, and insulating trenches 26. Four steering diodes 67 are formed by diffusion regions 24. Capacitor 44 and semiconductor die 10 are packaged together and coupled in parallel between conductive bumps 120A and 120B, which operate as terminals of the package.

A load 140, representing any circuit to be protected, is coupled between terminals 120A and 120B. Load 140 includes a power input terminal 142 and a ground voltage potential terminal 144. Load 140 receives a power signal at power input terminal 142, which is subject to periodic transient voltage spikes. Transient voltage spikes on power input terminal 142 are routed to ground node 144 through TVS diode 66 rather than through load 140. TVS diode 66 includes a capacitance that varies with input voltage. Capacitor 44 includes a larger capacitance that eclipses the non-linear TVS capacitance, resulting in TVS package 130 appearing to the system as a substantially linear capacitance.

In one embodiment, bumps 120A and 120B are coupled between terminals on a headphone jack of an electronic device rather than a power input terminal. Static discharge or other electrical shock experienced at the headphone jack is substantially absorbed by the TVS diode, which protects the circuitry within the electronic device. Capacitor 44 results in the overall capacitance of the TVS package having an increased linearity, and the absorption of the static discharge produces less harmonic interference than without capacitor 44. In other embodiments, a semiconductor die 10 with a TVS diode and MIM capacitor 44 is coupled between terminals of a power input, Universal Serial Bus (USB) port, or other I/O port of an electronic device to protect from transient voltages with reduced harmonic generation.

While one basic method of packaging TVS devices 110 is shown, other packaging techniques are used in other embodiments. In some embodiments, a package substrate or leadframe is used to support TVS device 110 and provide a desired type of package terminals.

Figure 4:
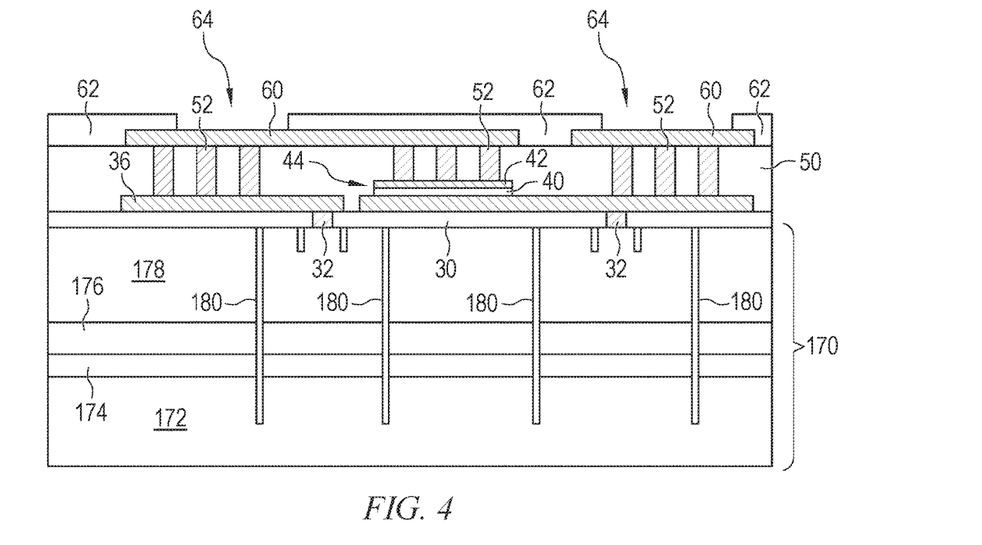
FIG. 4 illustrates an alternative TVS diode embodiment with the MIM capacitor.

FIG. 4 illustrates capacitor 44 formed over another TVS diode embodiment with snap-back. Semiconductor die 170 includes a p-doped base substrate 172. An n-doped layer 174 is formed on p-doped base substrate 172. Boron-Nitride (BN) isolation layer 176 is formed on n-doped layer 174. P-doped epitaxial layer 178 is formed over BN isolation layer 176. Insulation trenches 180 are formed into semiconductor die 170. MIM capacitor 44 is formed by conductive layer 36, dielectric layer 40, and conductive layer 42 as in FIG. 1c. MIM capacitor 44 is coupled in parallel with the underlying TVS device formed in semiconductor die 170.

Figure 5A:
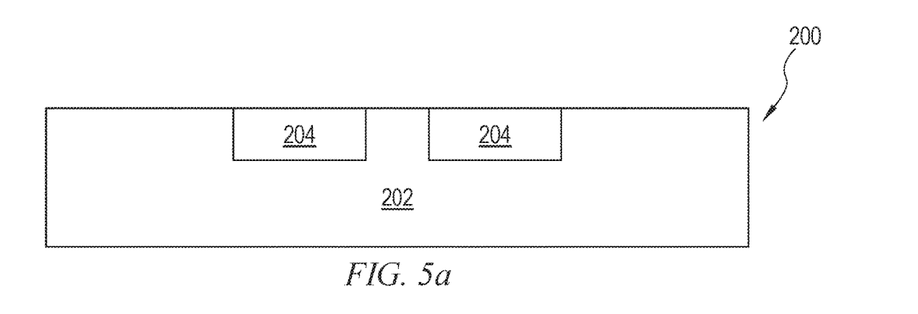
FIGS. 5a-5e illustrate forming a trench capacitor in a semiconductor die with a TVS diode.

FIGS. 5a-5e illustrate forming TVS device 200 having a trenched capacitor in parallel with a TVS diode. FIG. 5a illustrates an n-doped semiconductor substrate 202 with positively doped regions 204 formed within the substrate. Doped regions 204 and substrate 202 together form a bi-directional TVS diode. Other TVS topologies are used in other embodiments.

Figure 5B:
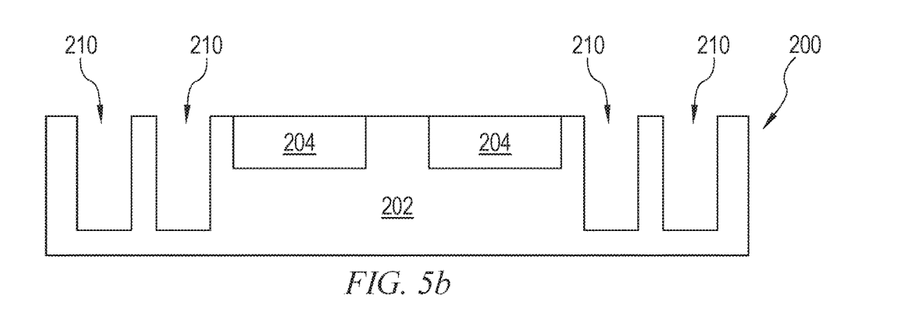
Figure 5C:
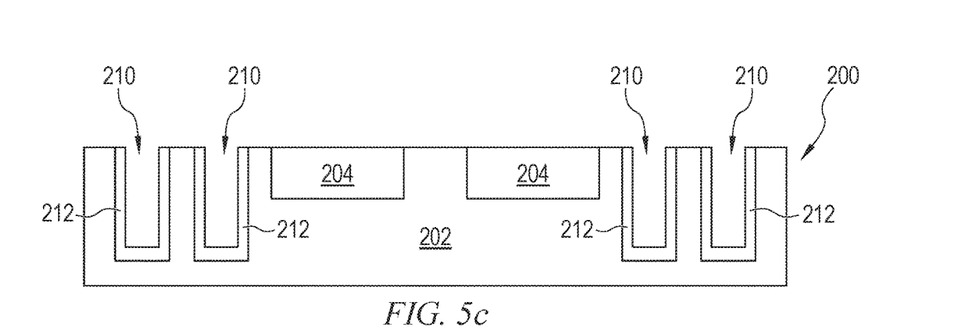

In FIG. 5b, trenches 210 are formed flanking the sides of the TVS diode formed in substrate 202. Trenches 210 are formed using a mask and chemical etching, plasma etching, deep reactive-ion etching, or other die etching methods. Trenches 210 can be stripes flanking opposite terminals of a TVS diode, a plurality of circular or polygonal vias, or other appropriate physical layout. A larger overall surface area of substrate 202 within trenches 210 increases total capacitance when metal in each of the trenches is coupled in parallel. A TVS diode is formed in a common substrate with trench capacitors in any suitable floorplan. Trenches 210 are lined with an insulating material 212 in FIG. 5c. In one embodiment, insulating material 212 is an oxide layer grown within or deposited into trenches 210. In some embodiments, insulating material 212 extends across the top or active surface of substrate 202 to isolate the substrate from subsequently formed metal layers.

Figure 5D:
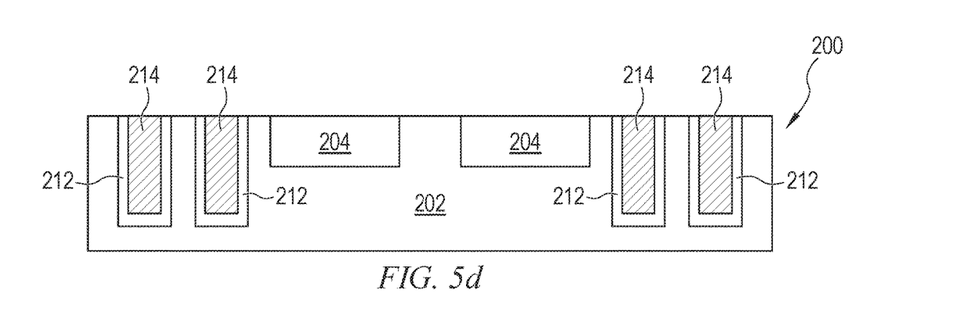
Figure 5E:
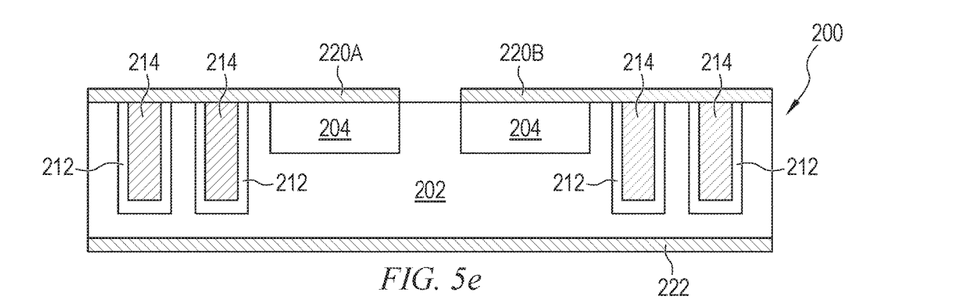

Polysilicon 214 is deposited into trenches 210 in FIG. 5d, followed by deposition of conductive layers 220-222 in FIG. 5e. In some embodiments, insulating material 212 extends over substrate 202 to isolate the substrate from conductive layer 220. Polysilicon 214 forms a capacitor with substrate 202, and insulating layer 212 operates as the capacitor dielectric. In other embodiments, conductive material other than polysilicon is deposited into trenches 210 to form a capacitor. Conductive layer 220 couples the TVS diode formed by p-doped regions 204 and n-doped substrate 202 in parallel with the capacitor formed between polysilicon 214 and substrate 202.

Figure 6:
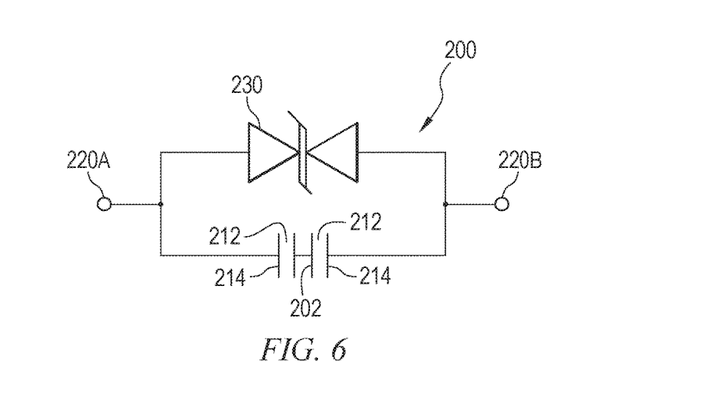
FIG. 6 illustrates a circuit diagram of the TVS diode with trench capacitors.

FIG. 6 illustrates a circuit diagram of TVS device 200 in FIG. 5e. Bi-directional TVS diode 230 is formed by p-doped regions 204 and n-doped substrate 202. Polysilicon 214 and substrate 202 form capacitors in parallel with TVS diode 230 between electrical contacts 220A and 220B. Capacitors in TVS device 200 are formed using the vertical area of the silicon to form polysilicon-filled trenches with an oxide liner. The trenched capacitor embodiment is useful when the underlying TVS structure's capacitance requires large values of oxide capacitance to mask the non-linearity of the TVS capacitance. The underlying TVS formed in substrate 202 can be a p-n junction device, a device that exhibits shallow or deep snap-back characteristics, or any other circuit protection device. The linear capacitance of polysilicon 214 dominates the non-linear capacitance of TVS diode 230, which helps reduce harmonics that could interfere with surrounding circuitry.

Figure 7A:
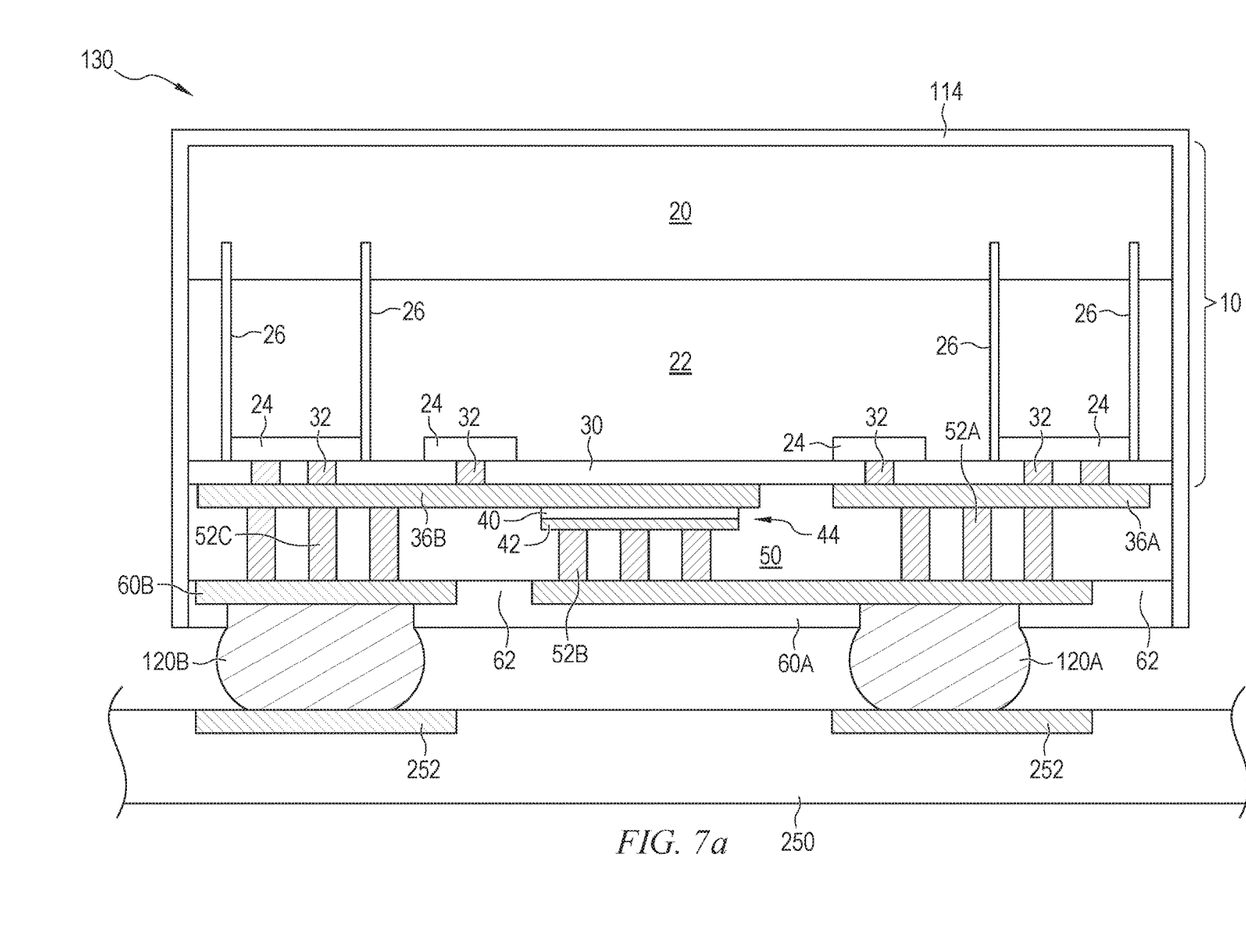
FIGS. 7a-7b illustrate usage of TVS diodes that have integrated capacitors to reduce harmonic generation.
Figure 7B:
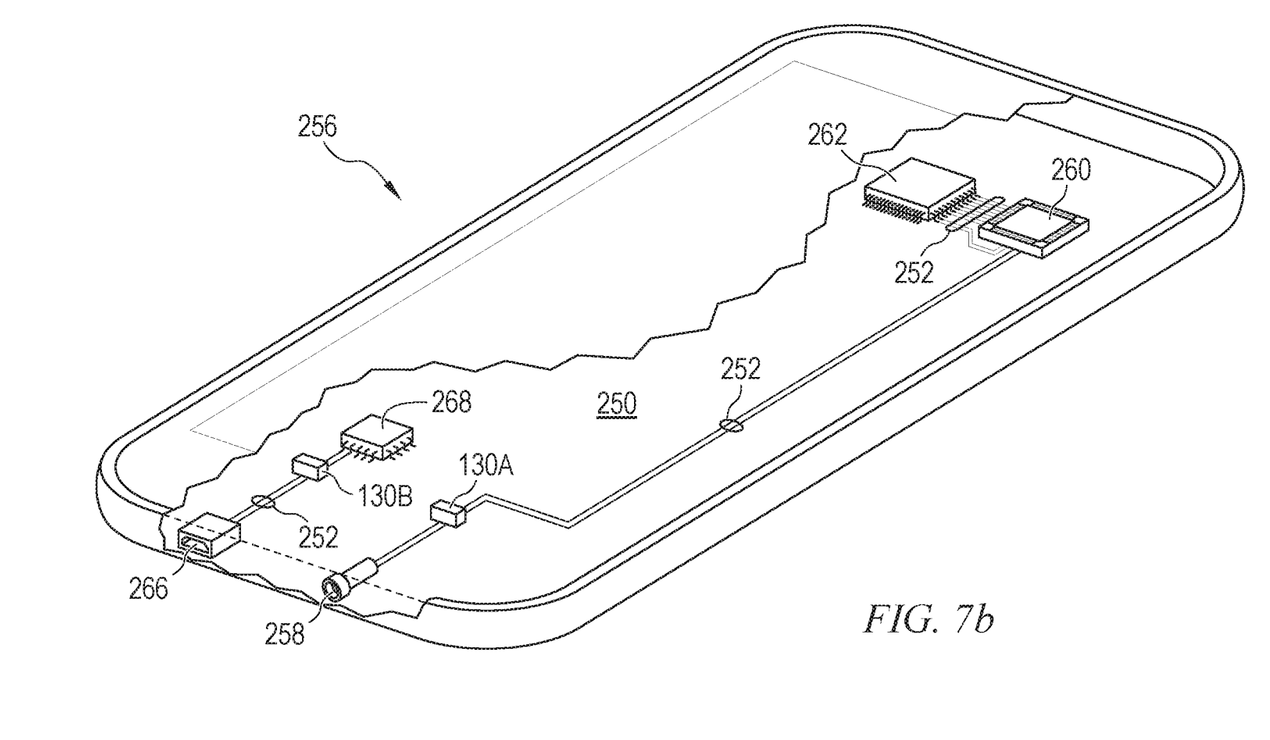

FIGS. 7a-7b illustrate incorporating the above-described TVS packages into an electronic device. FIG. 7a illustrates a partial cross-section of TVS package 130 from FIG. 2d mounted onto a PCB or other substrate 250 as part of an electronic device. Bumps 120 are reflowed onto conductive layer 252 to physically attach and electrically connect TVS package 130 to substrate 250. Any of the above-described TVS embodiments can similarly be mounted onto substrate 250. For the embodiment in FIG. 5e, TVS device 200 is packaged in a similar manner to TVS device 110 with bumps or another interconnect structure formed over conductive layer 220A and 220B. In some embodiments, an adhesive layer is used between TVS package 130 and PCB 250.

Semiconductor die 10 is electrically coupled to conductive layer 252 through bumps 120, conductive layer 60, electrical contacts 52, conductive layer 36, and electrical contacts 32.

FIG. 7b illustrates a cell phone, tablet computer, or other mobile device 256 as one example of an electronic device using TVS packages 130. Mobile device 256 includes a headphone jack 258 used to input or output audio signals. Conductive signal traces 252 couple headphone jack 258 to an audio processor chip 260. The analog signal is converted to digital and communicated to central processing unit (CPU) or system-on-chip (SoC) 262. Two signal traces 252 are shown connecting to headphone jack 258, which allows a single audio signal and ground signal. TVS package 130A is coupled between the two conductive traces 252 to route transient voltage spikes on the audio signal trace to the ground trace. In other embodiments, three audio signals are transmitted, stereo output and a mono microphone input. A triple-gang package with three TVS devices 110 attached by encapsulant 114 can be used to protect all three audio signal lines using a single package.

Mobile device 256 also includes a USB port 266 that provides power to the mobile device. Power and ground signals from a connected USB cord are routed to a power chip 268. Power chip 268 includes circuitry to control battery charging and ensure proper power to SoC 262, audio processor chip 260, and other semiconductor devices of the mobile device. TVS package 130B is coupled between the power and ground input signal traces 252 of USB port 266. TVS package 130B routes transient voltage spikes on the USB power input signal to ground to protect the parts of mobile device 256 from damage due to excess voltage input.

TVS packages 130A and 130B include integrated capacitors so that the overall capacitance of the packages does not significantly change when transient voltage spikes are experienced. The fixed or linear capacitance of the integrated capacitors overshadows the voltage-dependent capacitance of the TVS diodes. Reducing harmonics can be especially important in mobile devices such as cell phones, which include several antennae located at various locations within the mobile device. In many cases, one or more antennae are located nearby headphone jack 258 or USB port 266, and are therefore particularly susceptible to harmonic interference from ESD events on the ports. Including integrated MIM or trench capacitors in the TVS packages reduces harmonic generation, and thus reduces interference picked up by nearby antennae.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a semiconductor die;
   forming a transient voltage suppression (TVS) structure in the semiconductor die;
   forming a capacitor over the semiconductor die; and
   forming a semiconductor package with the TVS structure and capacitor coupled in parallel.

2. The method of claim 1, further including forming the capacitor by:
   depositing a first conductive layer over the semiconductor die;
   depositing an insulating layer over the first conductive layer; and
   depositing a second conductive layer over the insulating layer.

3. The method of claim 2, wherein the first conductive layer includes aluminum, and the second conductive layer includes titanium nitride (TiN).

4. The method of claim 1, further including forming the capacitor by:
   forming a trench in the semiconductor die;
   depositing an insulating material in the trench; and
   depositing a conductive material in the trench over the insulating material.

5. The method of claim 1, further including forming the TVS structure to include snap-back characteristics.

6. The method of claim 1, further including forming the semiconductor package to include a plurality of TVS structures.

7. A method of making a semiconductor device, comprising:
   providing a semiconductor die including a transient voltage suppression (TVS) structure formed in the semiconductor die; and
   forming a capacitor over the semiconductor die.

8. The method of claim 7, further including forming the capacitor by:
   depositing a first conductive layer over the semiconductor die;
   depositing an insulating layer over the first conductive layer; and
   depositing a second conductive layer over the semiconductor die.

9. The method of claim 8, wherein the first conductive layer includes aluminum, and the second conductive layer includes titanium nitride (TiN).

10. The method of claim 7, further including forming the capacitor by:
    forming a trench in the semiconductor die;
    depositing an insulating material in the trench; and
    depositing a conductive material in the trench.

11. The method of claim 7, further including forming a semiconductor package including the TVS structure and capacitor coupled in parallel.

12. The method of claim 11, further including coupling the semiconductor package in parallel with a load to protect the load from a transient voltage or electrostatic discharge event.

13. The method of claim 7, further including forming the TVS structure to include steering diodes.

14. A semiconductor device, comprising:
   a semiconductor die including a transient voltage suppression (TVS) structure formed in the semiconductor die;
   a capacitor formed over the semiconductor die;
   a first interconnect structure formed over the semiconductor die; and
   a second interconnect structure formed over the semiconductor die, wherein the TVS structure and capacitor are electrically coupled in parallel between the first interconnect structure and second interconnect structure.

15. The semiconductor device of claim 14, wherein the capacitor includes:
   a first conductive layer formed over the semiconductor die;
   an insulating layer formed over the first conductive layer; and
   a second conductive layer formed over the insulating layer.

16. The semiconductor device of claim 15, wherein the first conductive layer includes aluminum and the second conductive layer includes titanium nitride (TiN).

17. The semiconductor device of claim 14, wherein the capacitor includes:
   a trench formed in the semiconductor die;
   an insulating material deposited in the trench; and
   a conductive material deposited in the trench over the insulating material.

18. The semiconductor device of claim 14, wherein the semiconductor device includes a plurality of TVS structures packaged together.

19. The semiconductor device of claim 14, further including an electronic device including a substrate, wherein the TVS structure and capacitor are coupled to a substrate of the electronic device through the first interconnect structure and second interconnect structure.

20. A semiconductor device, comprising:
   a semiconductor die including a transient voltage suppression (TVS) structure formed in the semiconductor die; and
   a capacitor formed over the semiconductor die.

21. The semiconductor device of claim 20, wherein the semiconductor die and capacitor are packaged together.

22. The semiconductor device of claim 20, wherein the capacitor is a metal-insulator-metal (MIM) capacitor.

23. The semiconductor device of claim 20, wherein the capacitor is a trench capacitor.

24. The semiconductor device of claim 20, wherein the TVS structure includes steering diodes.

25. The semiconductor device of claim 20, wherein the TVS structure includes snap-back.

* * * * *